United States Patent
Yosra (10) Patent No.: US 12,140,621 B2
(45) Date of Patent: Nov. 12, 2024

(54) METHOD FOR GENERATING A MULTI-CARRIER REFLECTOMETRY SIGNAL HAVING THE FORM OF A "CHIRP" SIGNAL

(71) Applicant: COMMISSARIAT A L'ENERGIE ATOMIQUE ET AUX ENERGIES ALTERNATIVES, Paris (FR)

(72) Inventor: Gargouri Yosra, Gif-sur-Yvette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 188 days.

(21) Appl. No.: 17/891,955

(22) Filed: Aug. 19, 2022

(65) Prior Publication Data
US 2023/0099415 A1 Mar. 30, 2023

(30) Foreign Application Priority Data
Sep. 29, 2021 (FR) .................... 2110241

(51) Int. Cl.
*G01R 31/11* (2006.01)
*G01R 31/08* (2020.01)

(52) U.S. Cl.
CPC ............ *G01R 31/11* (2013.01); *G01R 31/085* (2013.01)

(58) Field of Classification Search
CPC .............................. G01R 31/11; G01R 31/085
See application file for complete search history.

(56) References Cited

U.S. PATENT DOCUMENTS

| | | | |
|---|---|---|---|
| 2015/0253370 A1* | 9/2015 | Fantoni | G01R 31/1272 702/58 |
| 2020/0116777 A1* | 4/2020 | Cabanillas | G01R 31/08 |

FOREIGN PATENT DOCUMENTS

FR 3 097 971 A1 1/2021

OTHER PUBLICATIONS

Ajamian, et al., "Compressed signal acquisition in wire diagnostic", 2017 IEEE Sensors, 2017.
Layer, et al., "Using quadrature modulation for precise fault location over wired communication channels", 2017 15th iEEE International New Circuits and Systems Conference (NEWCAS), pp. 357-360, 2017.
Tropp, et al., "Signal Recovery From Random Measurements via Orthogonal Matching Pursuit", IEEE Transactions on Information Theory, vol. 53, No. 12, pp. 4655-4666, 2007.
Ajamian, "Exploration of Compressive Sampling for Wire Diagnosis Systems Based on Reflectometry", Signal and Image processing. École centrale de Nantes, 2019.

* cited by examiner

*Primary Examiner* — Feba Pothen
(74) *Attorney, Agent, or Firm* — BakerHostetler (57) ABSTRACT

A method is provided for generating a multi-carrier reflectometry signal intended to be injected into a transmission line in order to identify a presence of at least one possible fault on the transmission line. The method includes: generating, in the frequency domain, a phase-modulated multi-carrier digital signal by: generating a digital signal, phase-modulating the digital signal based on a constellation of symbols, rounding the obtained phase to the phase of the symbol of the constellation that is closest, and converting the generated signal into the time domain.

11 Claims, 11 Drawing Sheets

METHOD FOR GENERATING A MULTI-CARRIER REFLECTOMETRY SIGNAL HAVING THE FORM OF A "CHIRP" SIGNAL

CROSS-REFERENCE TO RELATED APPLICATION

This application claims priority to foreign French patent application No. FR 2110241, filed on Sep. 29, 2021, the disclosure of which is incorporated by reference in its entirety.

FIELD OF THE INVENTION

The invention relates to the field of wired diagnostic systems based on the principle of reflectometry for identifying and characterizing electrical faults on cables or, more generally, on transmission lines. The invention relates more precisely to the field of OMTDR (orthogonal multi-tone time domain reflectometry) multi-carrier reflectometry, which uses multi-carrier signals generated based on the OFDM (orthogonal frequency division multiplexing) modulation principle.

BACKGROUND

The invention aims to propose a method for generating an OMTDR reflectometry signal having a "chirp" signal form, such a signal having advantageous properties in terms of peak-to-average power ratio and in terms of compressibility, this signal having a parsimonious nature.

Cables are omnipresent in all electrical systems in order to supply power or to transmit information. These cables are subject to stresses and may fail. It is therefore necessary to be able to analyze their state and provide information about the detection of faults that impact these cables, this information including the existence of faults, but also their location and their type. Fault analysis makes it possible to assist with cable maintenance. Conventional reflectometry methods enable this type of analysis.

Reflectometry methods use a principle close to that of radar: an electrical signal, the probe signal or reference signal, is injected at one or more locations of the cable to be tested. The signal propagates in the cable or the network of cables and returns a portion of its energy when it encounters an impedance discontinuity. An impedance discontinuity may be caused for example by a connection, by the end of the cable or by a fault or more generally by an interruption in the propagation conditions for the signal in the cable. It is caused by a fault that locally modifies the characteristic impedance of the cable by bringing about a discontinuity in its linear parameters.

Analyzing the signals returned to the injection point makes it possible to deduce therefrom information about the presence and the location of these discontinuities, and therefore possible faults. An analysis in the time or frequency domain is usually performed. These methods are denoted using the acronyms TDR, stemming from the expression "time domain reflectometry", and FDR, stemming from the expression "frequency domain reflectometry".

Multi-carrier reflectometry (MCR) uses multi-carrier signals. Its advantage is the great flexibility with which it is possible to modulate the spectrum of the transmitted signal, thereby thus making it possible to adapt to constraints specific to on-line diagnostics. For example, although it is forbidden to transmit on a frequency band located in the middle of the spectrum of the test signal, it is entirely possible to cancel out the energy of the signal on this frequency band. MCTDR ("multi-carrier time domain reflectometry") reflectometry is also known, as described in the document referenced [1].

OMTDR ("orthogonal multi-tone time domain reflectometry) reflectometry, which is based on the principle of OFDM, uses a multi-carrier signal (in the same way as for MCTDR reflectometry), but while adding a modulation, for example a PSK phase modulation or QAM phase and amplitude modulation to the signal to be transmitted. The OMTDR signals thus make it possible, simultaneously, to diagnose faults in a cable, but also to transmit information via the modulated signal.

The invention falls under the field of application of reflectometry-based wired diagnostic methods, and is applicable to any type of electric cable, in particular energy transmission cables or communication cables, in fixed or mobile installations. The cables in question may be coaxial, bifilar, in parallel rows, in twisted pairs or in another arrangement, provided that it is possible to inject a reflectometry signal into them at a point of the cable and to measure its reflection at the same point or at another point.

A first problem to be solved in a wired diagnostic system relates to the attenuation experienced by the signal injected into the cable to be analyzed, when it propagates along this cable until encountering a fault that causes a reflection. The reflection peak is usually determined through intercorrelation between the injected signal and the reflected signal. When the cable is lengthy compared to the wavelength of the signal, said signal experiences attenuation during propagation and back-propagation thereof, which is dependent on the distance travelled by the signal. This attenuation constitutes a major drawback during the step of analyzing the reflected signals through time reflectometry, which aims to identify an amplitude peak in the result of the intercorrelation between the transmitted signal and the reflected signal. Specifically, the more the signal is attenuated, the more difficult it is to detect the signature of a fault in the measurement of the reflected signal. This is all the more true when the targeted fault is a soft fault, that is to say one that corresponds to a small impedance variation, that is to say a superficial fault.

To limit the attenuation of the signal during propagation thereof in a cable, it is therefore desirable to use an amplifier to amplify the signal before it is injected in order to compensate for the effects of the attenuation.

However, signal amplifiers have a non-linear behavior that leads to saturation of high values of the signal to be amplified. This non-linear behavior is all the more present when the signal to be amplified has a high peak-to-average power ratio (or PAPR). This is the case for multi-carrier signals such as OFDM (orthogonal frequency division multiplexing) signals, or signals specifically dedicated to reflectometry, such as MCTDR (multi-carrier time domain reflectometry) or OMTDR (orthogonal multi-tone time domain reflectometry) signals that are based on the OFDM principle.

This non-linear behavior worsens the signal-to-noise ratio of the measurements that are performed, thereby producing a detrimental effect on the accuracy of the detection of faults, or even non-detection of faults in some cases, in particular for the case of soft faults.

There is therefore a need to reduce or limit the peak power of multi-carrier signals that are intended to be used by a reflectometry system.

A second problem to be solved relates to the widening of the spectral band of the signal, which is linked directly to the spatial resolution with which a fault is able to be detected. In other words, the higher the frequency band of the signal, the more it is possible to precisely locate a fault, even of very small size. However, a reflectometry system is limited by the sampling frequency of the analogue-to-digital converter. Indeed, the higher this frequency, the more expensive the converter is to implement, the more energy it consumes and the higher its noise level. Moreover, it is not possible in theory to correctly sample a signal having a frequency higher than the sampling frequency (Nyquist theorem).

One solution for overcoming this problem and for using wideband signals while still keeping an analogue-to-digital converter with a limited sampling frequency consists in using parsimonious signals that are naturally compressible in a particular domain defined by a database, for example in the time, frequency or time/frequency domain, and which make it possible to perform compressed sampling at a sampling frequency lower than the maximum frequency of the signal. However, OMTDR signals are by nature not parsimonious and are therefore not compressible.

SUMMARY OF THE INVENTION

One aim of the invention is to solve the abovementioned problems so as to develop OMTDR reflectometry signals that are parsimonious and that have a low peak factor.

Patent application FR3097971 from the Applicant describes a method for generating an OMTDR signal having a peak-to-average power ratio that is lower than a conventional OMTDR signal. The method is based on reserving subcarriers. It has the following drawbacks: it requires adaptation of the transmission chain through the addition of additional processing operations in order to modify the structure of the signal, thereby complicating the method. Moreover, the signal that is obtained is not parsimonious, and is therefore not compressible. It does not allow operation with an analogue-to-digital converter having a low sampling frequency.

Publication [1] describes an MCTDR reflectometry method comprising a compressed acquisition system that makes it possible to reduce the sampling frequency of the analogue-to-digital converter to a frequency lower than the maximum frequency of the signal. However, the described method is not compatible with an OMTDR signal.

The invention proposes a novel method for generating an optimized OMTDR signal in which the phases of the modulated symbols are determined in accordance with a specific distribution law that has the effect of modifying the form of the signal such that it is a "chirp" signal.

A "chirp" signal is a variable-frequency sinusoidal signal. In other words, it is a frequency-modulated pseudo-periodic signal with a frequency that evolves over time in accordance with a predetermined law of evolution, for example a linear or logarithmic law of evolution. By design, a "chirp" signal has a parsimonious structure in the time/frequency plane and also has a low peak factor.

The invention thus makes it possible to generate an OMTDR signal having the form of a "chirp" signal, thereby making it possible to solve the problems identified above.

One subject of the invention is a method for generating a multi-carrier reflectometry signal intended to be injected into a transmission line in order to identify the presence of at least one possible fault on the line, the method comprising the steps of:
Generating, in the frequency domain, a phase-modulated multi-carrier digital signal by:
i. Generating a digital signal,
ii. Phase-modulating the digital signal based on a constellation of symbols, the phase $\theta_k$ of each modulated symbol being determined based on the following equality: $\theta_k = \pm(\alpha * k^2)$, where k is the index of each carrier of the signal and varies between 1 and the number of carriers N of the signal,
iii. a is a coefficient within the interval $$\left[\frac{\pi}{N} - \frac{\pi}{2N}; \frac{\pi}{N} + \frac{\pi}{2N}\right],$$

iv. Rounding the obtained phase $\theta_k$ to the phase of the symbol of the constellation that is closest,
Converting the generated signal into the time domain.
According to one particular aspect of the invention, the phase $\theta_k$ of each modulated symbol is determined based on the following equality:

$$\theta_k = \pm(\alpha * k^2) + \gamma \frac{\pi}{N} k + \delta,$$

where γ is a relative integer and & is a constant.

According to one particular aspect of the invention, the constellation of symbols is a constellation of a PSK phase modulation or of a QAM phase and amplitude modulation.

According to one particular aspect of the invention, the generated signal is a frequency-modulated pseudo-periodic "chirp" signal.

In one variant embodiment, the method according to the invention furthermore comprises the steps of:
Converting the generated digital signal into an analogue signal,
Injecting the analogue signal into a transmission line.

Another subject of the invention is a method for identifying the presence of at least one possible fault on a transmission line, the method comprising the steps of:
Generating a multi-carrier reflectometry signal and injecting it into a transmission line by way of the method according to the invention,
Acquiring and analyzing the echo of said reflected reflectometry signal in order to deduce therefrom information relating to the detection and/or the location of an impedance discontinuity characteristic of at least one fault.

According to one particular aspect of the invention, the step of analyzing the echo of the reflectometry signal comprises the substeps of:
computing the intercorrelation between the reflected reflectometry signal and the reflectometry signal injected into the line, in order to obtain a reflectogram,
analyzing the reflectogram in order to identify at least one amplitude peak characteristic of the presence of a fault on the line.

According to one particular aspect of the invention, the step of analyzing the echo of the reflectometry signal comprises the substeps of:
Multiplying the acquired reflectometry signal by a pseudorandom sequence,
Applying a low-pass filter to the obtained signal,
Converting the filtered signal into digital,
Reconstructing the signal.

Another subject of the invention is a computer program comprising instructions for executing the method for generating a reflectometry signal according to the invention when the program is executed by a processor.

Another subject of the invention is a recording medium able to be read by a processor and on which there is recorded a program comprising instructions for executing the method for generating a reflectometry signal according to the invention when the program is executed by a processor.

Another subject of the invention is a device for generating a reflectometry signal intended to be injected into a transmission line in order to identify the presence of at least one possible fault on the line, said device comprising means designed to implement the method for generating a reflectometry signal according to the invention.

The device according to the invention may comprise a reflectometry signal generator configured so as to implement the method for generating a reflectometry signal according to the invention, a digital-to-analogue converter (DAC) and a coupling device for injecting the analogue reflectometry signal into a transmission line.

BRIEF DESCRIPTION OF THE DRAWINGS

Other features and advantages of the present invention will become more clearly apparent upon reading the following description with reference to the following appended drawings.

DETAILED DESCRIPTION

Figure 1:
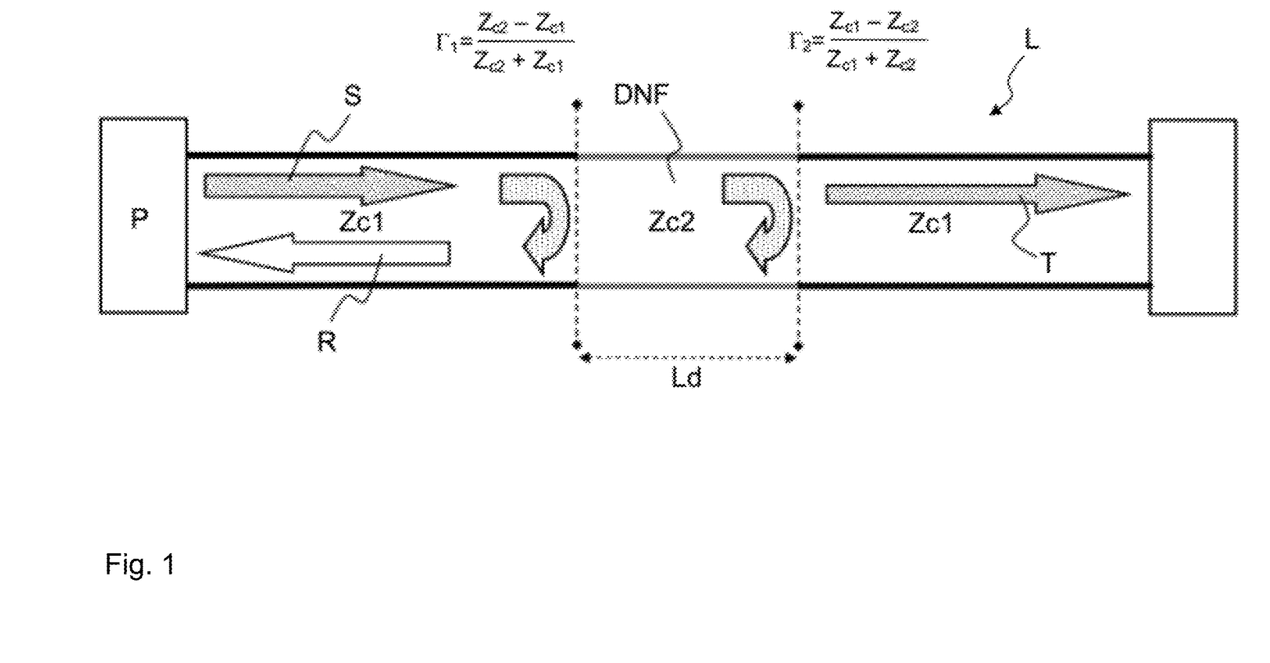
FIG. 1 shows a diagram illustrating the known principle of time reflectometry and its application to the detection of a soft fault.

FIG. 1 schematically shows, as a reminder, the operating principle of a reflectometry-based diagnostic method applied to a transmission line L exhibiting a soft fault DNF. The example described below corresponds to a time-domain reflectometry method.

A reference signal S is injected into the transmission line at a point P. The reflected signal R is measured at the same point P (or at another point of the line). This signal propagates in the line and encounters, while it is propagating, a first impedance discontinuity at the start of the soft fault DNF. The signal is reflected from this discontinuity with a reflection coefficient $\Gamma_1$. If the characteristic impedance $Z_{c2}$ in the region of the soft fault DNF is less than the characteristic impedance $Z_{c1}$ before the occurrence of the fault, then the reflection coefficient $\Gamma_1$ is negative and results in a peak of negative amplitude in the reflected signal R. In the opposite case, the reflection coefficient $\Gamma_1$ is positive and results in a peak of positive amplitude in the reflected signal R.

The transmitted portion T of the incident signal S continues to propagate through the line and then encounters a second impedance discontinuity, creating a second reflection of the incident signal with a reflection coefficient $\Gamma_2$ of a sign opposite to the first reflection coefficient $\Gamma_1$. If $\Gamma_1<0$, then $\Gamma_2>0$. If $\Gamma_1>0$, then $\Gamma_2<0$.

Figure 2:
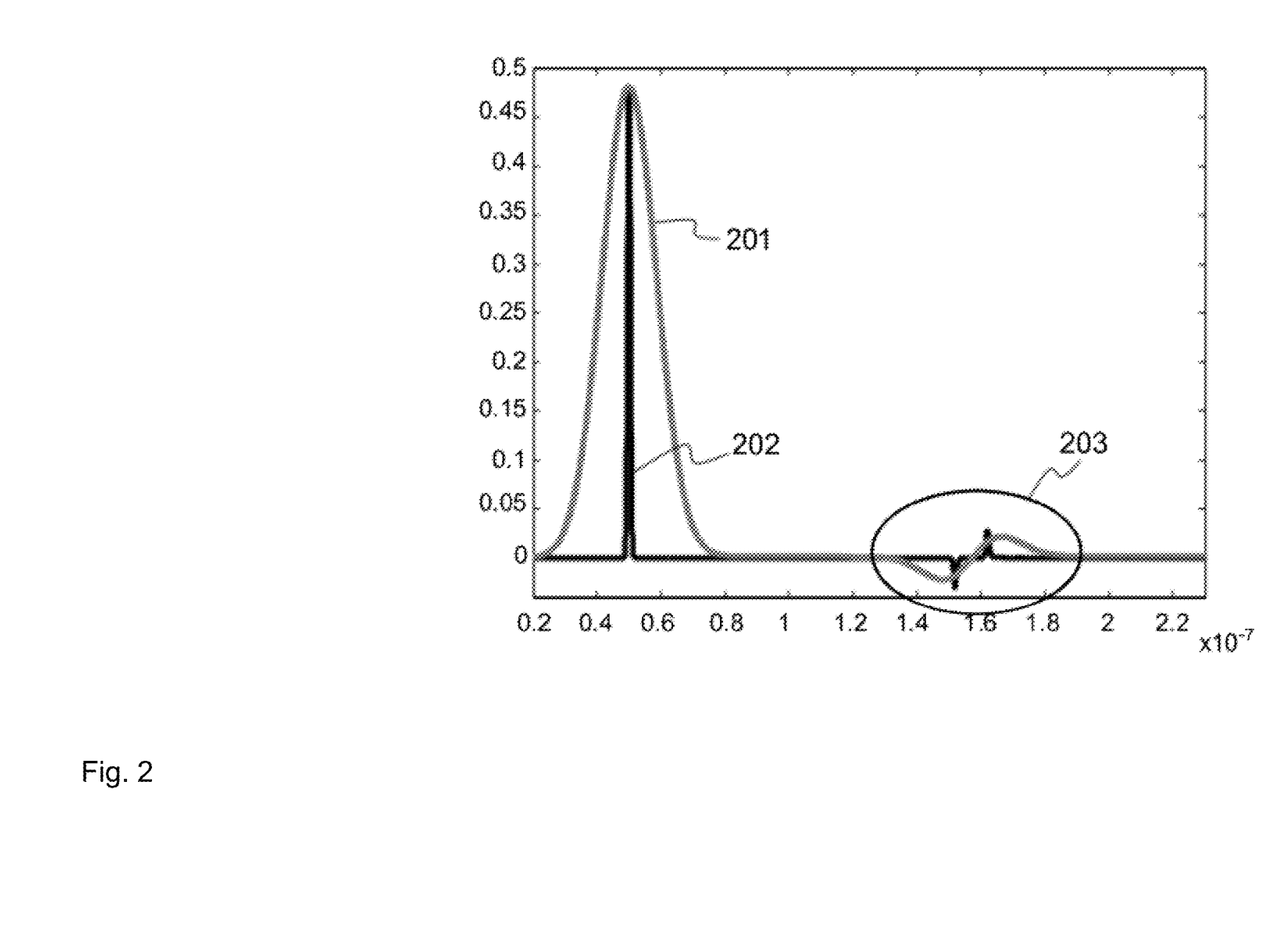
FIG. 2 shows an example of two reflectograms, illustrating the trend of the signature of a soft fault, one obtained by injecting a signal having high-frequency components, the other by injecting a signal having low-frequency components.

Thus, by observing the reflected signal R, the signature of the soft fault DNF is characterized by two successive peaks of opposing signs, as shown in FIG. 2.

FIG. 2 shows a time reflectogram that corresponds either directly to the measurement of the reflected signal R or to the intercorrelation between the reflected signal R and the signal injected into the cable S.

In the case where the injected reference signal is a time-dependent pulse, this corresponding to the case of a time-domain reflectometry method, the reflectogram may correspond directly to the measurement of the reflected signal R. In the case where the injected reference signal is a more complex signal, for example for MCTDR (multi-carrier time-domain reflectometry) or OMTDR (orthogonal multi-tone time-domain reflectometry) methods, then the reflectogram is obtained by intercorrelating the reflected signal R and the injected signal S.

FIG. 2 shows two reflectograms 201, 202 corresponding to signals having, respectively, two different maximum frequencies. Curve 201 corresponds to a pulse duration $2 \cdot \Delta T$ much longer than the time taken by the signal to pass through the soft fault DNF. With the length of the fault being denoted Ld, this duration is equal to Ld/V, where V is the propagation speed of the signal through the cable. The curve 202 corresponds to a pulse duration $2 \cdot \Delta T$ much shorter than the time taken by the signal to pass through the soft fault DNF.

In both cases, the signature 203 of the soft fault, in the reflectogram, is always composed of the succession of a first peak and second peak the signs of which are opposite.

The distance between the two peaks characterizes the length of the soft fault, and their amplitude characterizes the severity of the soft fault. Specifically, the larger the variation in the characteristic impedance, the higher the amplitude of the signature of the soft fault in the reflectogram.

As is known in the field of reflectometry-based diagnostic methods, the position $d_{DNF}$ of the soft fault in the cable, or in other words its distance from the point P of injection of the signal, may be obtained by directly measuring, in the time reflectogram of FIG. 2, the duration $t_{DNF}$ between the first amplitude peak recorded in the reflectogram (at the x-coordinate 0.5 in the example of FIG. 2) and the amplitude peak 203 corresponding to the signature of the soft fault.

Various known methods may be contemplated for determining the position $d_{DNF}$. A first method consists in applying the relationship linking distance and time: $d_{DNF}=V \cdot t_{DNF}/2$, where V is the speed of propagation of the signal through the cable. Another possible method consists in applying a proportionality relationship of the type $d_{DNF}/t_{DNF}=L/t_0$, where L is the length of the cable and to is the duration, measured on the reflectogram, between the amplitude peak corresponding to the impedance discontinuity at the injection point and the amplitude peak corresponding to the reflection of the signal off the endpoint of the cable.

Figure 3:
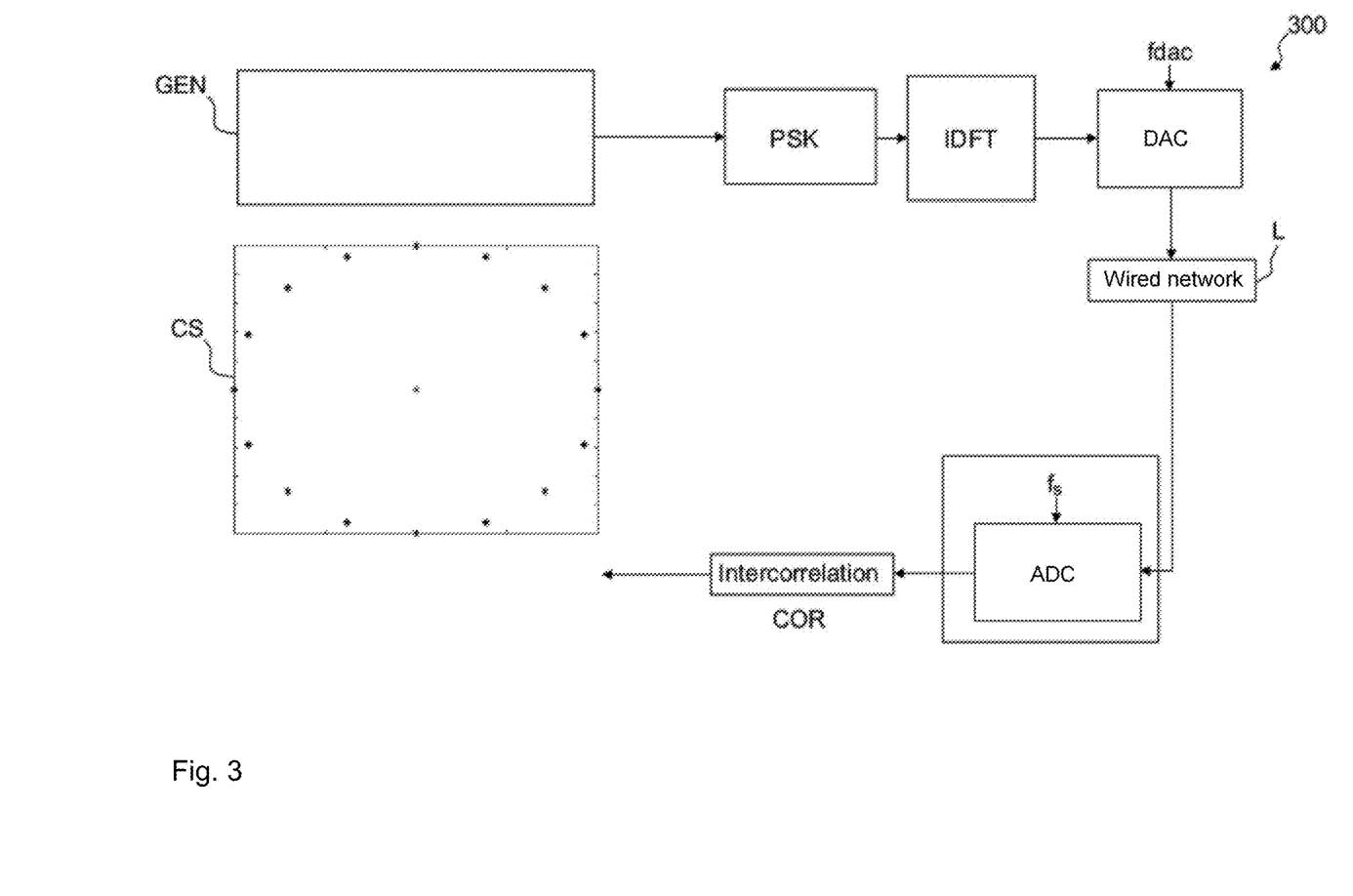
FIG. 3 shows a diagram of an OMTDR reflectometry system according to the prior art.

FIG. 3 shows a diagram of a system 300 for analyzing a fault in a transmission line L, such as a cable or a wired network, implementing an OMTDR reflectometry method according to the prior art.

Such a system 300 comprises a generator GEN for generating a digital reference signal. The signal is modulated via a phase modulator MOD using a PSK (phase shift keying) modulation. The PSK modulation is associated with a constellation of symbols CS. The example of FIG. 3 shows a constellation of a 16PSK modulation. The bits of the digital signal are randomly associated with the symbols of the PSK constellation. In other words, the modulated symbols are for example generated directly randomly so as to construct the modulated digital signal. The modulated signal is then synthesized in the time domain by way of an inverse discrete Fourier transform module IDFT. The synthesized signal is then converted into analogue via a digital-to-analogue converter DAC and is then injected at a point of the transmission line L by way of a coupler or any other device for injecting a signal into a line. The signal propagates along the line and reflects off the singularities that it contains. In the absence of a fault on the line, the signal reflects off the endpoint of the line if the termination of the line is not matched. In the presence of a fault on the line, the signal reflects off the impedance discontinuity caused by the fault. The reflected signal is propagated back to a measurement point, which may be the same as the injection point or different. The back-propagated signal is converted into digital by an analogue-to-digital converter ADC. A correlation COR is then made between the measured digital signal and a copy of the digital signal generated prior to injection in order to produce a time reflectogram R(t) corresponding to the intercorrelation between the two signals.

An OMTDR signal is based on OFDM technology and consists in using mutually orthogonal frequency subcarriers to form the test signal.

Each amplitude, phase or frequency is used to encode a certain number of bits, called a symbol. The binary data may be random or convey an information message.

The amplitude and the phase of an OFDM subcarrier are fixed by the binary data to be transmitted in accordance with the chosen type of modulation (M-PSK or M-QAM).

One example of a possible modulation for an OMTDR signal is M-PSK modulation, since this has good autocorrelation properties due to the fact that the spectrum of the signal is flat.

In a phase shift keying modulation (M-PSK), M is the order of the modulation (4 for Q-PSK, 8 for 8-PSK, 16 for 16-PSK etc.), and each subcarrier $S_k$ is defined by its amplitude and its phase as follows:

$$|s_k| = 1 \forall f_n \, et \, \phi(k) = \phi_n = i\frac{2\pi}{M}$$

where i is between 0 and M−1.

As for any digital modulation technique, the phase in question is able to take only a finite number of values. Each of the values of the phase represents a single binary number (also called a symbol), the size of which (and therefore the amount of information transmitted) depends on the number of possible values for the phase. Generally speaking, for a given PSK modulation, the represented binary numbers are all of the same size.

For example, for an 8-PSK modulation, the sequence of digital data to be sent: 000 001 011 010 101 corresponds to the sequence of symbols: 5 4 3 2 7 and to the sequence of phases 5π/8, 4π/8, 3π/8, 2π/8, 7π/8, according to one exemplary implementation.

An OMTDR signal with symbols (and therefore phases) that are chosen randomly generally has a poor peak-to-average power ratio PAPR. Moreover, such a signal is not compressible in the time, frequency and time/frequency plane, as illustrated in FIG. 4.

Figure 4:
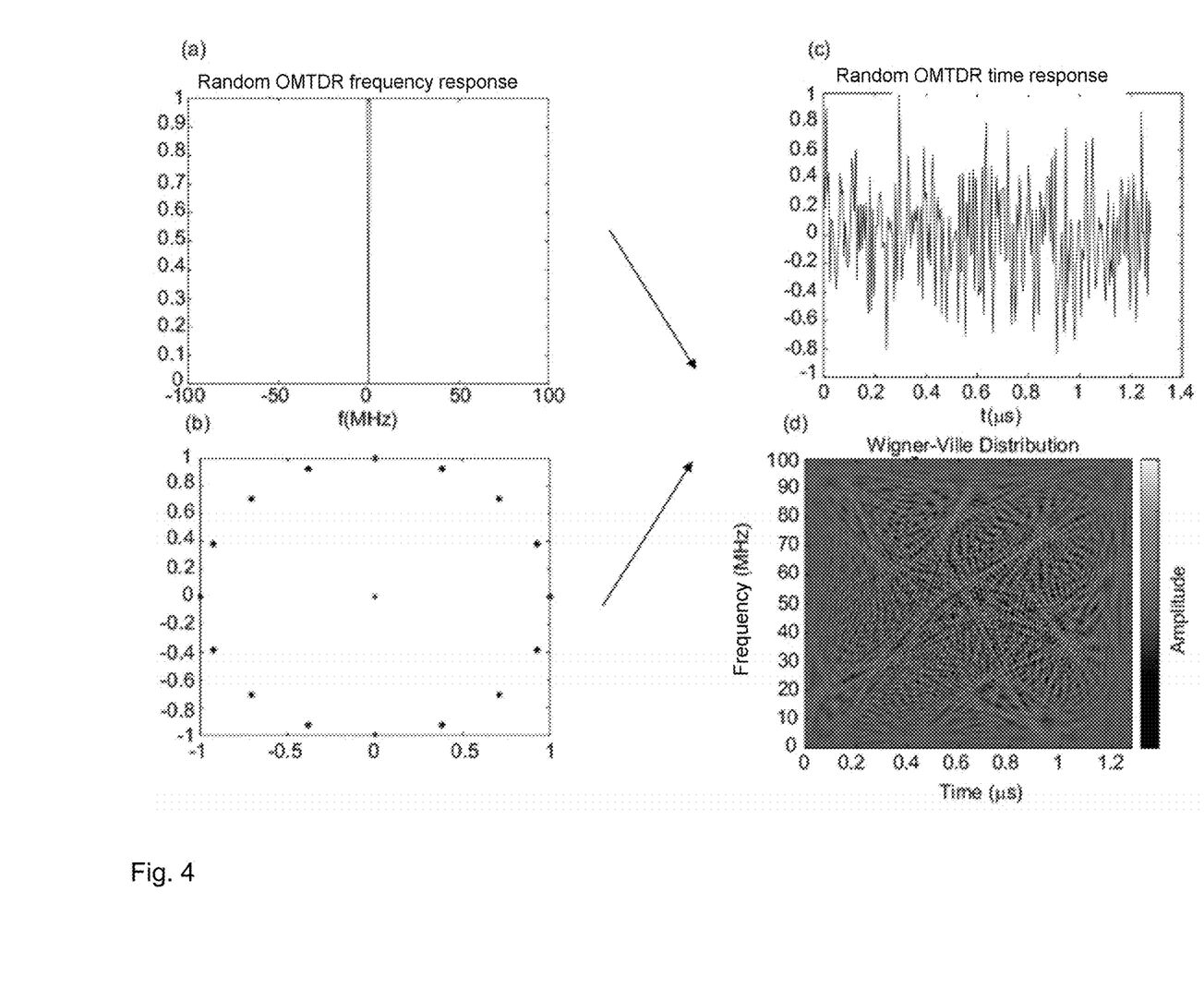
FIG. 4 illustrates, on multiple graphs, the characteristics of an OMTDR signal according to the prior art.

The graphs in FIG. 4 show various characteristics of a conventional OMTDR signal modulated with a 16-PSK modulation.

FIGS. 4a) and 4b) correspond, respectively, to the modulus of the frequency response of the signal and to the 16-PSK constellation graph of the signal with randomly generated phases.

FIG. 4c) shows the temporal response of the signal and FIG. 4d) shows the distribution of the signal in the time/frequency plane, obtained by applying a Wigner-Ville transform to the signal.

It is noted that the signal is dense in the time/frequency plane, in other words that it is not parsimonious. Such a signal is therefore not compressible.

The invention aims to propose a novel method for generating an OMTDR signal that makes it possible to construct a signal having a "chirp" form while still complying with the constraints of the adopted modulation.

Figure 5:
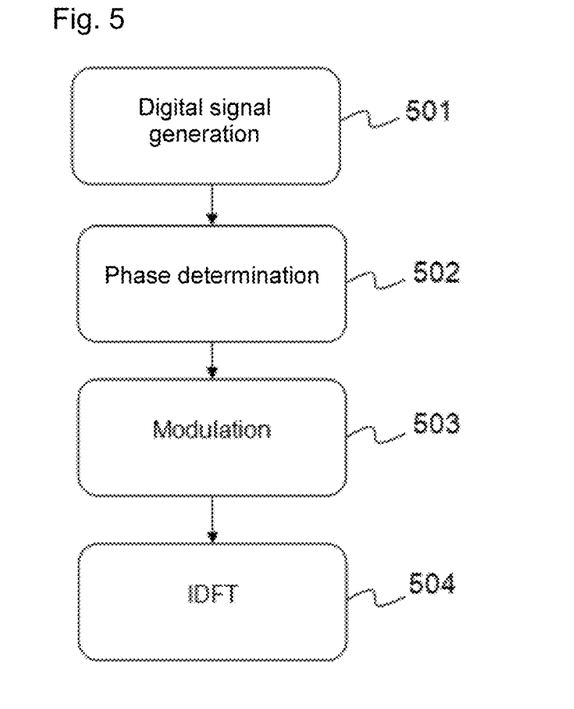
FIG. 5 shows a flowchart detailing the steps for implementing the method for generating an optimized OMTDR signal according to one embodiment of the invention.

FIG. 5 schematically shows, on a flowchart, the steps for implementing the method according to the invention for one example in which the modulation that is used is an MPSK modulation.

In step 501, a digital signal in the form of a sequence of bits is generated.

The digital signal is modulated by an MPSK modulation by associating each digital symbol with an MPSK constellation point.

For this purpose, in step 502, a phase is determined for each symbol to be modulated, using the following expression:

$$\theta_k = \pm(\alpha * k^2) + \gamma\frac{\pi}{N}k + \delta \quad (1)$$

k is the index of a carrier of the signal, k varying from 1 to N, where N is the number of subcarriers.

α is a coefficient within the interval $$\left[\frac{\pi}{N} - \beta; \frac{\pi}{N} + \beta\right],$$

where $$\beta = \frac{\pi}{2N}$$

γ is a real number that is positive, negative or zero,
δ is a constant.

Relationship (1) notably has the effect of generating a signal having the structure of a "chirp" signal.

However, the phases that are thus generated do not necessarily correspond to symbols of the chosen MPSK constellation.

In step 503, the phases generated in step 502 are rounded to the phases of the symbols of the MPSK constellation that are closest.

Finally, in step 504, an inverse discrete Fourier transform step is applied in order to generate the OMTDR signal.

The choice of the coefficient α makes it possible to structure the signal so that it has the form of a chirp signal. In particular, a coefficient α chosen close to $$\frac{\pi}{N},$$

for example within the interval $$\left[\frac{\pi}{N} - \beta; \frac{\pi}{N} + \beta\right],$$

where $$\beta = \frac{\pi}{2N},$$

makes it possible to obtain a signal having a chirp signal form while still minimizing the peak factor (PAPR).

The coefficients γ and δ influence the reduction of the peak factor (PAPR) of the signal.

According to a first exemplary embodiment of the invention, the coefficient α is taken to be equal to $$-\frac{\pi}{N},$$

the coefficient γ is taken to be equal to 1 and the coefficient δ is taken to be equal to 0.

In other words, in this example, the phases are generated using the relationship:

$$\theta_k = -\frac{\pi}{N}k^2 + \frac{\pi}{N}k \qquad (2)$$

Figure 6:
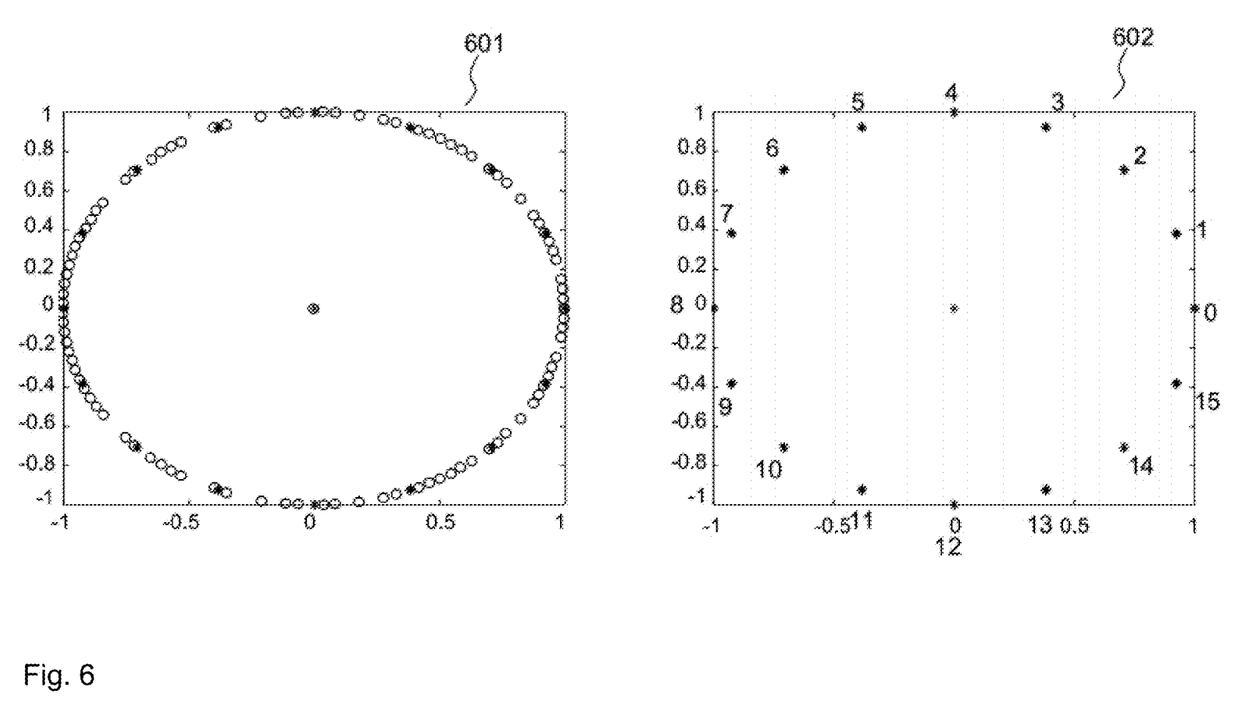
FIG. 6 shows two diagrams of constellations of phase-modulated symbols corresponding to two different steps of the invention.

FIG. 6 illustrates, on the phase diagram 601, the phases generated using relationship (2) (step 502) and, on the diagram 602, the symbols of the 16 PSK constellation that are obtained by rounding the phases of the diagram 601.

Figure 7:
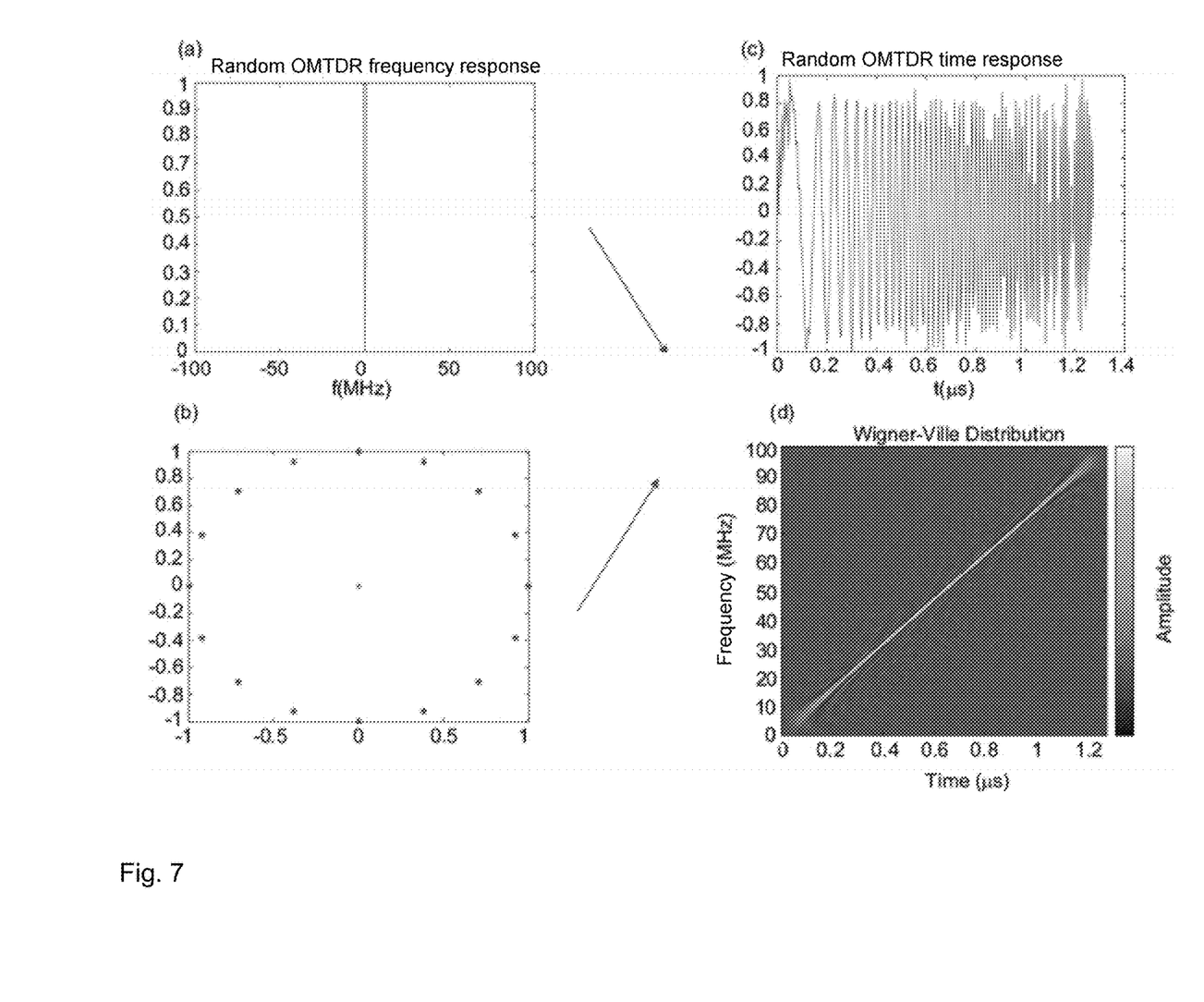
FIG. 7 illustrates, on multiple graphs, the characteristics of one example of an OMTDR signal obtained using the method according to the invention.

FIG. 7 shows, on the same graphs as in FIG. 4, the characteristics of the OMTDR signal that are obtained with the first exemplary embodiment of the invention above.

It is noted that the representation of the signal in the time/frequency plane (graph d)) follows a linear evolution that is characteristic of a chirp signal. This property makes it possible to obtain a signal that is parsimonious and therefore compressible and that has a low peak factor PAPR.

By way of illustration, Table 1 below shows examples of peak-to-average power ratio (PAPR) results for various PSK modulations and various numbers N of carriers, for a conventional OMTDR signal.

TABLE 1

| Constellation | Number of points | | |
|---|---|---|---|
| | 256 | 512 | 1024 |
| 32 | 9.81 dB | 10.46 dB | 10.88 dB |
| 16 | 9.74 dB | 10.10 dB | 10.91 dB |
| 8 | 9.52 dB | 10.17 dB | 10.96 dB |
| 4 | 9.27 dB | 10.74 dB | 11.14 dB |

Table 2 below shows the same results for an OMTDR signal obtained with the first exemplary embodiment of the invention.

TABLE 2

| Constellation | Number of points | | |
|---|---|---|---|
| | 256 | 512 | 1024 |
| 32 | 4.11 dB | 3.94 dB | 3.65 dB |
| 16 | 3.9 dB | 4.68 dB | 4.3 dB |
| 8 | 4.91 dB | 5.46 dB | 6.64 dB |
| 4 | 8.31 dB | 7.33 dB | 7.22 dB |

It is seen that the peak factor PAPR is greatly reduced thanks to the invention.

Other examples of phase determination laws for obtaining the same technical effects are for example the following laws:

$$\theta_k = \frac{\pi}{N}k^2 - 2\frac{\pi}{N}k + \frac{\pi}{N}$$

$$\theta_k = -\frac{\pi}{N}k^2$$

$$\theta_k = \frac{\pi}{N}k^2 + \frac{\pi}{N}$$

$$\theta_k = \frac{\pi}{N-1}k^2 - \frac{3\pi}{N-1}k + \frac{2\pi}{N-1}$$

The invention is applicable to M-PSK phase modulations, but also to M-QAM phase and amplitude modulations.

According to a first embodiment, the invention may be implemented by way of the device of FIG. 3, the OMTDR digital signal generator being replaced by a generator configured so as to execute the method for constructing a modified OMTDR signal according to the invention.

Figure 8:
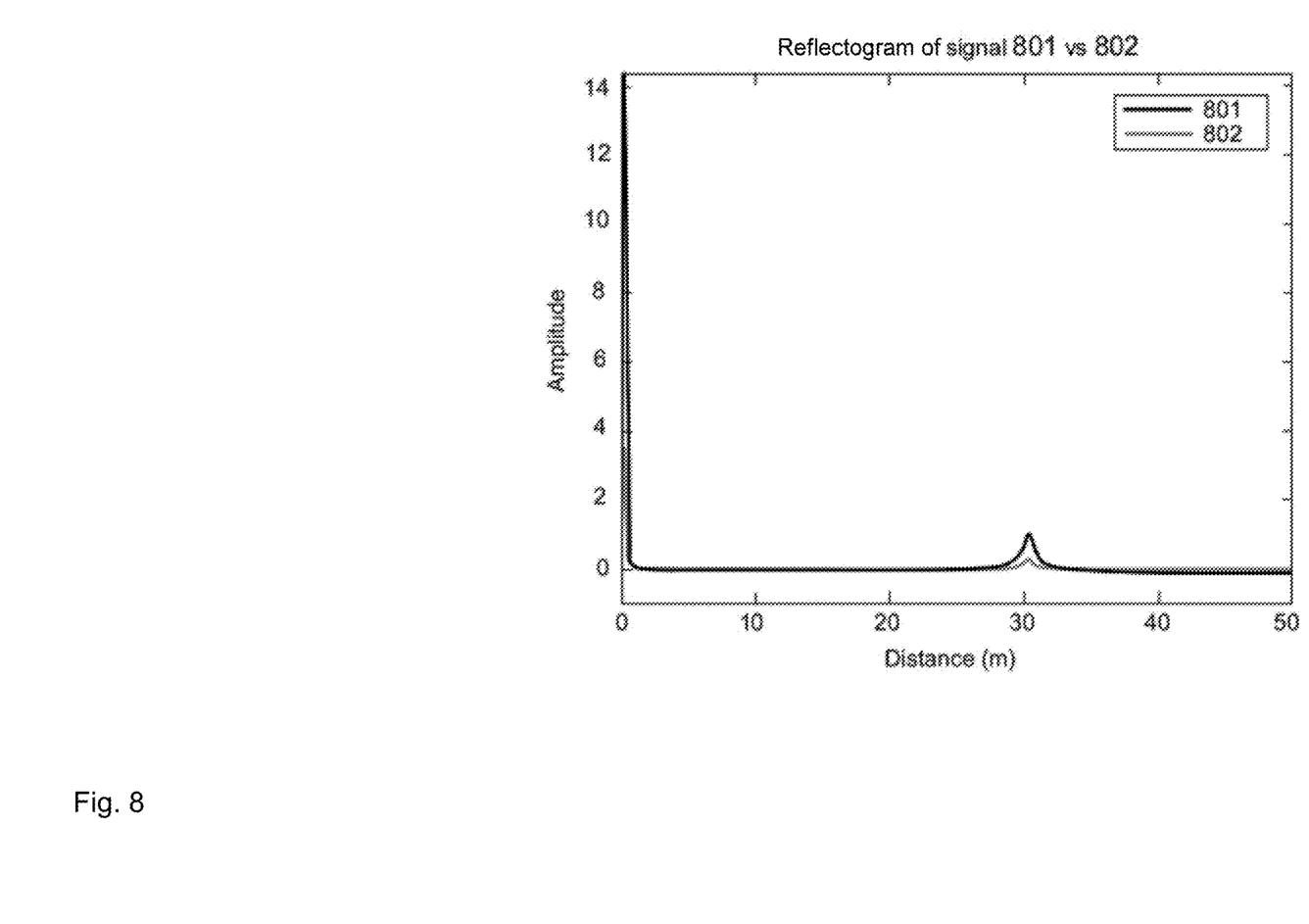
FIG. 8 shows a comparative reflectogram illustrating the results obtained with a conventional OMTDR signal and an OMTDR signal generated with the invention.

FIG. 8 shows two examples of reflectograms 801, 802 respectively obtained with an OMTDR system from the prior art and an OMTDR system according to the first embodiment of the invention.

In these two examples, an electrical fault is located at a distance of 30 m from the injection point of the signal. This fault is characterized by a peak 803 in the measured reflectogram. It may be seen in FIG. 8 that the improved OMTDR signal according to the invention makes it possible to amplify the peak 803 in comparison with the conventional OMTDR signal. Due to the improvement in the peak factor PAPR of the signal, the detection gain of the peak 803 is improved.

The invention thus makes it possible to reduce the peak-to-average power ratio of an OMTDR signal in order to improve fault detection precision through analysis of a reflectogram.

The invention also makes it possible to make an OMTDR signal parsimonious and compressible in the time/frequency domain.

Figure 9:
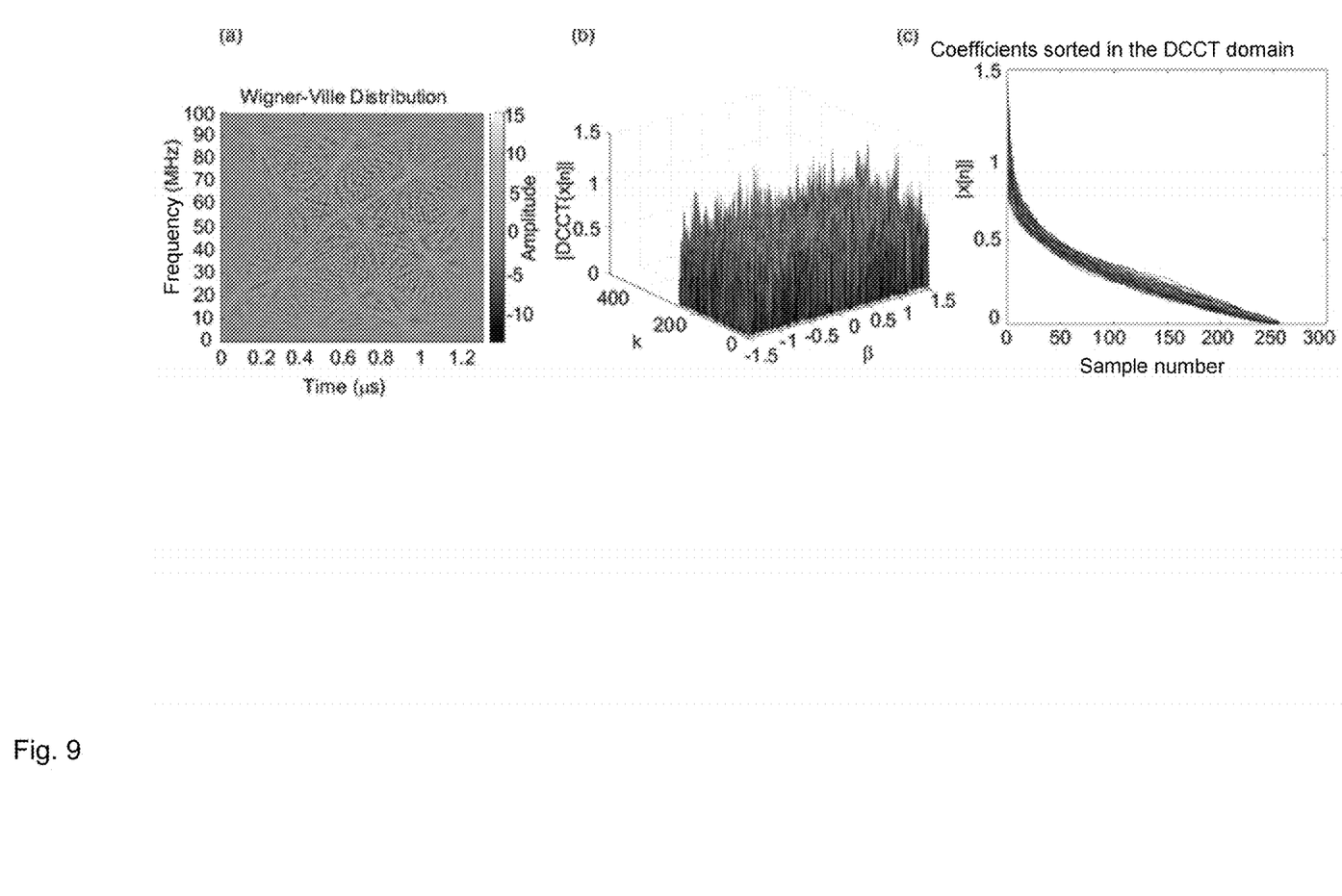
FIG. 9 shows, on multiple graphs, certain characteristics of a conventional OMTDR signal, for evaluating its compressibility.

FIG. 9 illustrates, in three graphs, the fact that a conventional OMTDR signal with random generation of the modulated symbols is neither parsimonious nor compressible.

A signal is compressible in a domain if the moduli of its coefficients sorted in this domain decrease rapidly. Consideration is thereafter given to the domain of the DCCT (discrete cosine chirp transform) transform, which is used as a parsimonious signal representation base as indicated in reference [1].

FIG. 9a) illustrates the time/frequency representation of a conventional OMTDR signal and shows that this signal is dense in the time/frequency plane.

FIG. 9b) is a graph of the representation of the same OMTDR signal after applying a DCCT transform. It may also be noted that the distribution of the DCCT coefficients is dense and not parsimonious.

Finally, FIG. 9c) shows a curve of the moduli of the DCCT coefficients obtained in FIG. 9b) sorted in descending order. It is seen that these coefficients have a decrease towards zero that is relatively slow. The distribution of the coefficients is distributed over a wide range of values.

A conventional OMTDR signal is thus not parsimonious and cannot be compressed in the DCCT domain.

Figure 10:
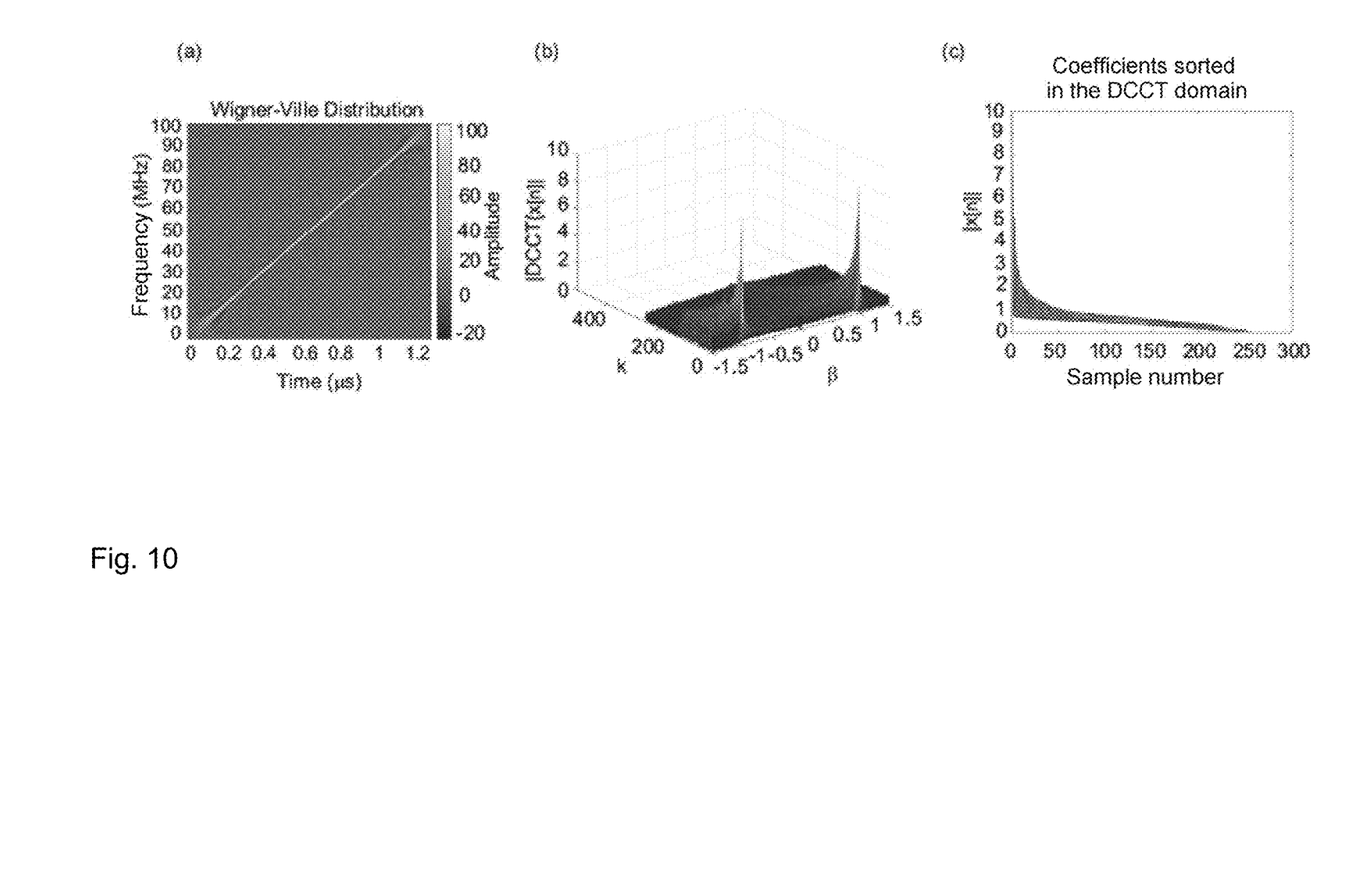
FIG. 10 shows the same graphs as in FIG. 9, but for an OMTDR signal obtained based on one embodiment of the invention.

FIG. 10 illustrates the same graphs as in FIG. 9, but this time for an OMTDR signal generated using the invention.

FIG. 10a) shows that the time/frequency representation of the signal follows a linear evolution.

FIGS. 10b) and 10c) show that the distribution of the moduli of the DCCT coefficients of the signal is parsimonious, that is to say that a large number of the coefficients are close to zero.

The OMTDR signal generated using the invention is therefore compressible in the DCCT domain.

Document [1] describes in detail a method for reducing the sampling frequency of an analogue-to-digital converter in a reflectometry system when the signal that is used is compressible in the DCCT domain.

Figure 11:
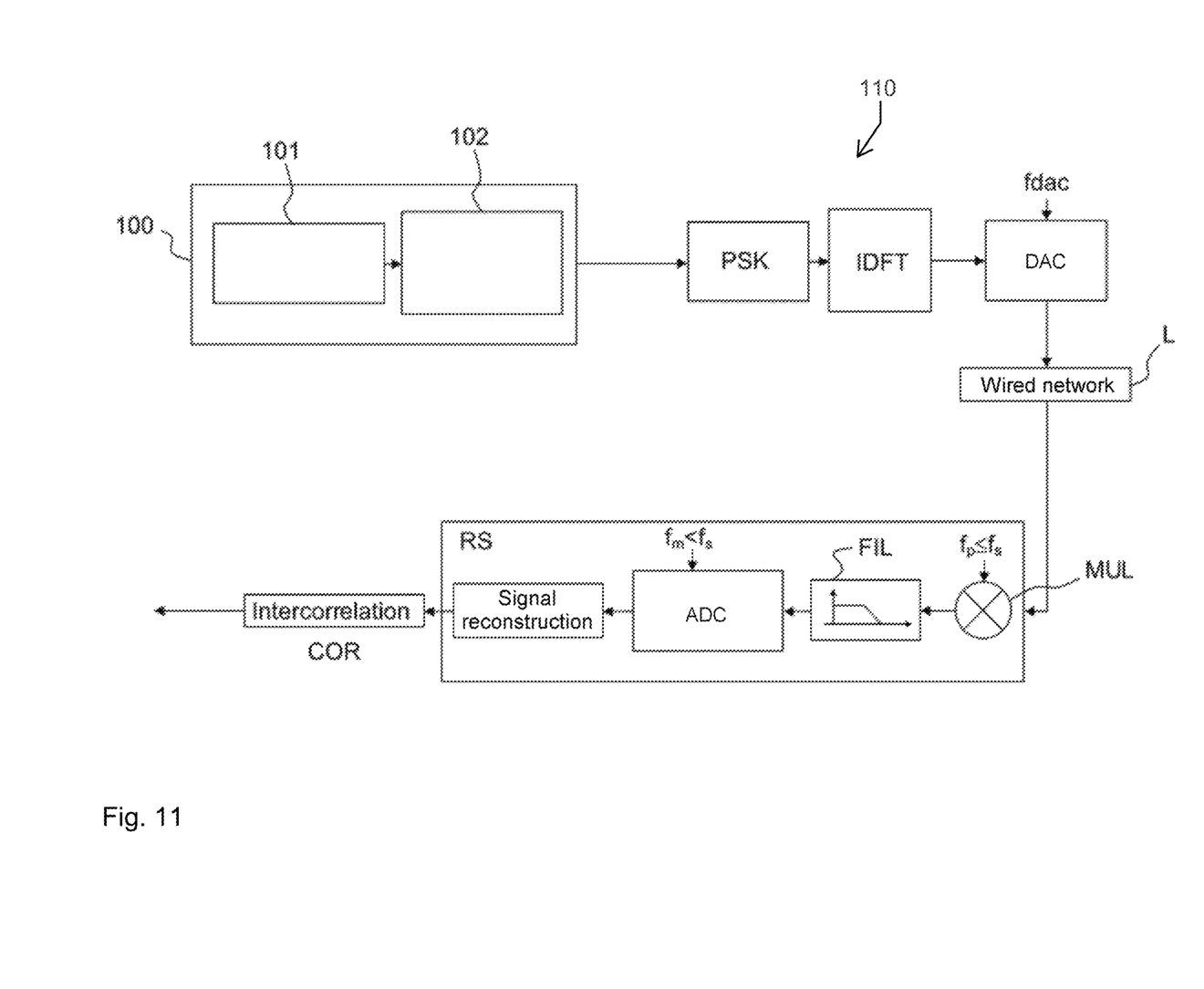
FIG. 11 shows a diagram of a compressed-acquisition reflectometry system according to a second embodiment of the invention.

FIG. 11 shows a diagram of a reflectometry system 110 according to a second embodiment of the invention.

The system 110 comprises a module 100 for generating an OMTDR signal according to the invention, comprising at least a module 101 for generating phases and a module 102 for rounding the generated phases to the closest symbols of the chosen constellation.

The system 110 then comprises a modulator MOD, an inverse Fourier transform module IDFT and a digital-to-analogue converter DAC. These three elements are identical to those already described in FIG. 3.

The system 110 differs from the reflectometry system described in FIG. 1 in that the analogue-to-digital converter ADC is replaced by a compressed-acquisition system ACQ that makes use of the parsimonious nature of the generated OMTDR signal.

The system ACQ is described in detail in document [1], to which those skilled in the art may refer for more information with regard to its implementation.

The system ACQ comprises a multiplier or mixer MUL that has the role of multiplying the signal measured at the coupler output by a pseudorandom sequence of +/−1 values. The mixer MUL operates at a frequency fp that may be greater than the Nyquist frequency fs.

The system ACQ then comprises a low-pass filter FIL the cutoff frequency of which depends on the desired compression factor, and then an analogue-to-digital converter ADC that operates at a sampling frequency fm that is lower than the frequency fp of the signal.

A module RS for reconstructing the signal makes it possible to reconstruct the signal before performing the intercorrelation COR with a copy of the generated signal.

Various techniques for reconstructing the signal may be implemented by the module RS. One possible exemplary implementation consists in applying a greedy algorithm, making it possible to iteratively construct a parsimonious approximation of the signal. One example of a greedy algorithm is the "orthogonal matching pursuit" algorithm described in reference [2].

REFERENCES

[1] "Ajamian, T. (2019). Exploration of Compressive Sampling for Wire Diagnosis Systems Based on Reflectometry (Doctoral dissertation, École centrale de Nantes)" [2]
[2] Joel A Tropp and Anna C Gilbert, "Signal recovery from random measurements via orthogonal matching pursuit", in: IEEE Transactions on information theory 53.12 (2007), pp. 4655-4666.

The invention claimed is:

1. A method for generating a multi-carrier reflectometry signal intended to be injected into a transmission line in order to identify a presence of at least one possible fault on the transmission line, the method comprising the steps of:
generating, in the frequency domain, a phase-modulated multi-carrier digital signal by:
generating a digital signal,
phase-modulating the digital signal based on a constellation of symbols, a phase $\theta_k$ of each modulated symbol being determined based on the following equality: $\theta_k = \pm(\alpha * k^2)$, where k is an index of each carrier of the signal and varies between 1 and a number of carriers N of the signal, wherein $\alpha$ is a coefficient within an interval $$\left[\frac{\pi}{N} - \frac{\pi}{2N}; \frac{\pi}{N} + \frac{\pi}{2N}\right],$$

rounding the obtained phase $\theta_k$ to a phase of the symbol of the constellation that is closest,
converting the generated phase-modulated and rounded signal into the time domain,
converting the time domain signal into an analogue signal, and
injecting the analogue signal into the transmission line.

2. The method for generating a multi-carrier reflectometry signal according to claim 1, wherein the phase $\theta_k$ of each modulated symbol is determined based on the following equality:

$$\theta_k = \pm(\alpha * k^2) + \gamma \frac{\pi}{N} k + \delta,$$

where $\gamma$ is a relative integer and $\delta$ is a constant.

3. The method for generating a multi-carrier reflectometry signal according to claim 1, wherein the constellation of symbols is a constellation of a PSK phase modulation or of a QAM phase and amplitude modulation.

4. The method for generating a multi-carrier reflectometry signal according to claim 1, wherein the generated signal is a frequency-modulated pseudo-periodic "chirp" signal.

5. The method for identifying a presence of at least one possible fault on a transmission line, the method comprising the steps of:

generating a multi-carrier reflectometry signal and injecting the multi-carrier reflectometry signal into a transmission line by way of the method according to claim 1, and acquiring and analyzing an echo of said reflected reflectometry signal in order to deduce therefrom information relating to a detection and/or a location of an impedance discontinuity characteristic of at least one fault.

6. The method for identifying the presence of at least one fault according to claim 5, wherein the analyzing the echo of the reflectometry signal comprises the substeps of:

computing an intercorrelation between the reflected reflectometry signal and the reflectometry signal injected into the transmission line, in order to obtain a reflectogram, and analyzing the reflectogram in order to identify at least one amplitude peak characteristic of the presence of a fault on the transmission line.

7. The method for identifying the presence of at least one fault according to claim 5, wherein the analyzing the echo of the reflectometry signal comprises the substeps of:

multiplying the acquired reflectometry signal by a pseudorandom sequence, applying a low-pass filter to the multiplied signal, converting the filtered signal into digital, and reconstructing the digital filtered signal.

8. A computer program comprising instructions for executing the method for generating a reflectometry signal according to claim 1 when the program is executed by a processor.

9. A non-transitory recording medium able to be read by a processor and on which there is recorded a program comprising instructions for executing the method for generating a reflectometry signal according to claim 1 when the program is executed by a processor.

10. A device for generating a reflectometry signal intended to be injected into a transmission line in order to identify a presence of at least one possible fault on the transmission line, said device comprising means configured to implement the method for generating a reflectometry signal according to claim 1.

11. A device for generating an analogue reflectometry signal intended to be injected into a transmission line in order to identify a presence of at least one possible fault on the transmission line, said device comprising means designed to implement the method for generating a reflectometry signal according to claim 1, the device comprising:

a reflectometry signal generator configured so as to implement the method for generating a reflectometry signal according to claim 1, a digital-to-analogue converter (DAC), and a coupling device for injecting the analogue reflectometry signal into a transmission line.

* * * * *